United States Patent
Wei et al.

(10) Patent No.: US 8,154,061 B2
(45) Date of Patent: Apr. 10, 2012

(54) BOTTOM GATE THIN FILM TRANSISTOR AND ACTIVE ARRAY SUBSTRATE

(75) Inventors: Chuan-Sheng Wei, Taichung County (TW); Guang-Ren Shen, Yunlin County (TW); Chang-Yu Huang, Taipei (TW); Pei-Ming Chen, Taipei County (TW); Sheng-Chao Liu, Hsinchu County (TW); Chun-Hsiun Chen, Hsinchu (TW); Wei-Ming Huang, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 496 days.

(21) Appl. No.: 12/500,609

(22) Filed: Jul. 10, 2009

(65) Prior Publication Data
US 2010/0270551 A1    Oct. 28, 2010

(30) Foreign Application Priority Data
Apr. 24, 2009  (TW) .............................. 98113690 A

(51) Int. Cl.
*H01L 31/062* (2006.01)
(52) U.S. Cl. ............................. 257/291; 257/E29.151
(58) Field of Classification Search .................... 257/59, 257/72, 291, 443, E27.131, E29.151
See application file for complete search history.

(56) References Cited

U.S. PATENT DOCUMENTS
| 6,191,476 | B1 | 2/2001 | Takahashi et al. |
| 6,998,287 | B2 | 2/2006 | Lee |
| 7,550,308 | B2 * | 6/2009 | Yoshinaga et al. .............. 438/34 |

FOREIGN PATENT DOCUMENTS
| CN | 1612359 | 5/2005 |
| JP | 2000-332253 | 11/2000 |
| TW | 200403856 | 3/2004 |

OTHER PUBLICATIONS

1st Office Action of counterpart China application, issued on Mar. 11, 2010, p. 1-p. 5.

* cited by examiner

*Primary Examiner* — Quoc Hoang
(74) *Attorney, Agent, or Firm* — Jianq Chyun IP Office

(57) ABSTRACT

A bottom gate thin film transistor and an active array substrate are provided. The bottom gate thin film transistor includes a gate, a gate insulation layer, a semiconductor layer, a plurality of sources and a plurality of drains. The gate insulation layer is disposed on the gate. The semiconductor layer is disposed on the gate insulation layer and located above the gate. An area ratio of the semiconductor layer and the gate is about 0.001 to 0.9. The sources are electrically connected with each other, and the drains are electrically connected with each other.

15 Claims, 7 Drawing Sheets

BOTTOM GATE THIN FILM TRANSISTOR AND ACTIVE ARRAY SUBSTRATE

CROSS-REFERENCE TO RELATED APPLICATION

This application claims the priority benefit of Taiwan application serial no. 98113690, filed on Apr. 24, 2009. The entirety of the above-mentioned patent application is hereby incorporated by reference herein and made a part of specification.

BACKGROUND OF THE INVENTION

1. Field of the Invention

The present invention relates to a thin film transistor and an active array substrate having the same, and more particularly to a bottom gate thin film transistor and an active array substrate having the same.

2. Description of Related Art

The increasing progresses of the display technology bring great conveniences to people's daily life, in which flat panel displays (FPDs) become popular due to its feature of being light and thin. In various FPDs, liquid crystal displays (LCDs) are widely used due to its advantages of high space utility rate, low power consumption, free of radiation, and low electromagnetic interference, and the like.

In general, the LCD is mainly assembled by an active array substrate, a color filter substrate, and a liquid crystal (LC) layer sandwiched between the two substrates. The active array substrate has an active region and a peripheral circuit region. An active array is located within the active region and a driving circuit including a plurality of bottom gate thin film transistors (TFTs) is located within the peripheral circuit region.

Generally, for the consideration of high mobility, high stability, and low cost, semiconductor layers of the bottom gate TFTs in the driving circuit are manufactured with amorphous. A channel current $I_{on}$ of the TFT is proportional to a ratio of the width and the length (W/L) of the channel and satisfies the following equation:

$I_{on}=Cox*U*W/L(V_G-V_{th})V_D$, wherein Cox is the gate capacitance per unit area, U is mobility of carriers, W is channel width, L is channel length, $V_G$ is gate voltage, $V_{th}$ is threshold voltage, and $V_D$ is drain voltage. Consequently, the channel current $I_{on}$ is increased by increasing the channel width. However, the increase in channel width usually affects the layout of bottom gate TFTs.

Conventionally, multiple pairs of sources and drains are disposed to avoid the effect on the device layout. Moreover, the ratio of the channel width and length is increased by arranging the sources and the drains alternately. Nevertheless, even though this method increases the channel current, but the self-heating resulted from the high channel current can not be conducted out effectively, so as to result in poor reliability of the devices.

SUMMARY OF THE INVENTION

The present invention is directed to a bottom gate thin film transistor (TFT) having enhanced heat dissipation ability.

The present invention is directed to an active array substrate capable of solving poor reliability of devices caused by self-heating.

A bottom gate TFT including a gate, a gate insulation layer, a semiconductor layer, a plurality of sources, and a plurality of drains is provided in the present invention. The gate insulation layer is disposed on the gate. The semiconductor layer is disposed on the gate insulation layer and located above the gate. An area ratio of the semiconductor layer and the gate is about 0.001 to 0.9. The sources are electrically connected with each other and the drains are electrically connected with each other. Moreover, the sources and the drains are electrically insulated.

According to an embodiment of the present invention, the aforementioned gate is, for example, a quadrilateral gate and the semiconductor layer is a quadrilateral semiconductor layer, for instance.

According to an embodiment of the present invention, the quadrilateral gate is, for example, a square gate and the semiconductor layer is a square semiconductor layer, for instance.

According to an embodiment of the present invention, the quadrilateral gate is a rectangular gate, for example, and the semiconductor layer is a rectangular semiconductor layer, for instance.

According to an embodiment of the present invention, extending directions of the sources and the drains are parallel to the two short sides of the quadrilateral gate, and the sources and the drains respectively extend above the semiconductor layer from the two long sides of the quadrilateral gate.

According to an embodiment of the present invention, the sources and the drains are alternately arranged on the semiconductor layer, for instance.

According to an embodiment of the present invention, the shortest distance between at least one side of the quadrilateral gate and one side of the quadrilateral semiconductor layer is greater than 3 micrometer (μm).

According to an embodiment of the present invention, the extending directions of the sources and the drains are parallel to each other, for example, and the sources and the drains extend above the semiconductor layer respectively from the two pairs of sides of the quadrilateral gate.

According to an embodiment of the present invention, the sources and the drains are alternately arranged on the semiconductor layer, for instance.

According to an embodiment of the present invention, the semiconductor layer, for instance, is an amorphous layer.

According to an embodiment of the present invention, the semiconductor layer is, for example, a plurality of individual semiconductor patterns. In addition, a space is maintained between any two adjacent semiconductor patterns.

According to an embodiment of the present invention, the space, for instance, is about 3 μm to 100 μm.

According to an embodiment of the present invention, the gate is a quadrilateral gate, for example, and the semiconductor layer is a quadrilateral semiconductor layer.

According to an embodiment of the present invention, the shortest distance between at least one side of the quadrilateral gate and one side of the quadrilateral semiconductor layer is greater than 3 μm.

An active array substrate including a substrate, a driving circuit, and an active array is further provided in the present invention. The substrate has an active region and a peripheral circuit region. The driving circuit is disposed on the substrate and located within the peripheral circuit region. The driving circuit includes a plurality of bottom gate TFTs above-mentioned. The active array is disposed on the substrate, located within the active region, and electrically connected to the driving circuit.

In light of the foregoing, by increasing the area of the gate, reducing the area of the semiconductor layer, or altering the shapes of the semiconductor layer and the gate, the area ratio of the semiconductor layer and the gate ranges from 0.001 to 0.9. As a result, the heat dissipation efficiency is enhanced effectively so as to conduct out the self-heating resulted from the increase in the channel current, thereby enhancing the reliability of the devices.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
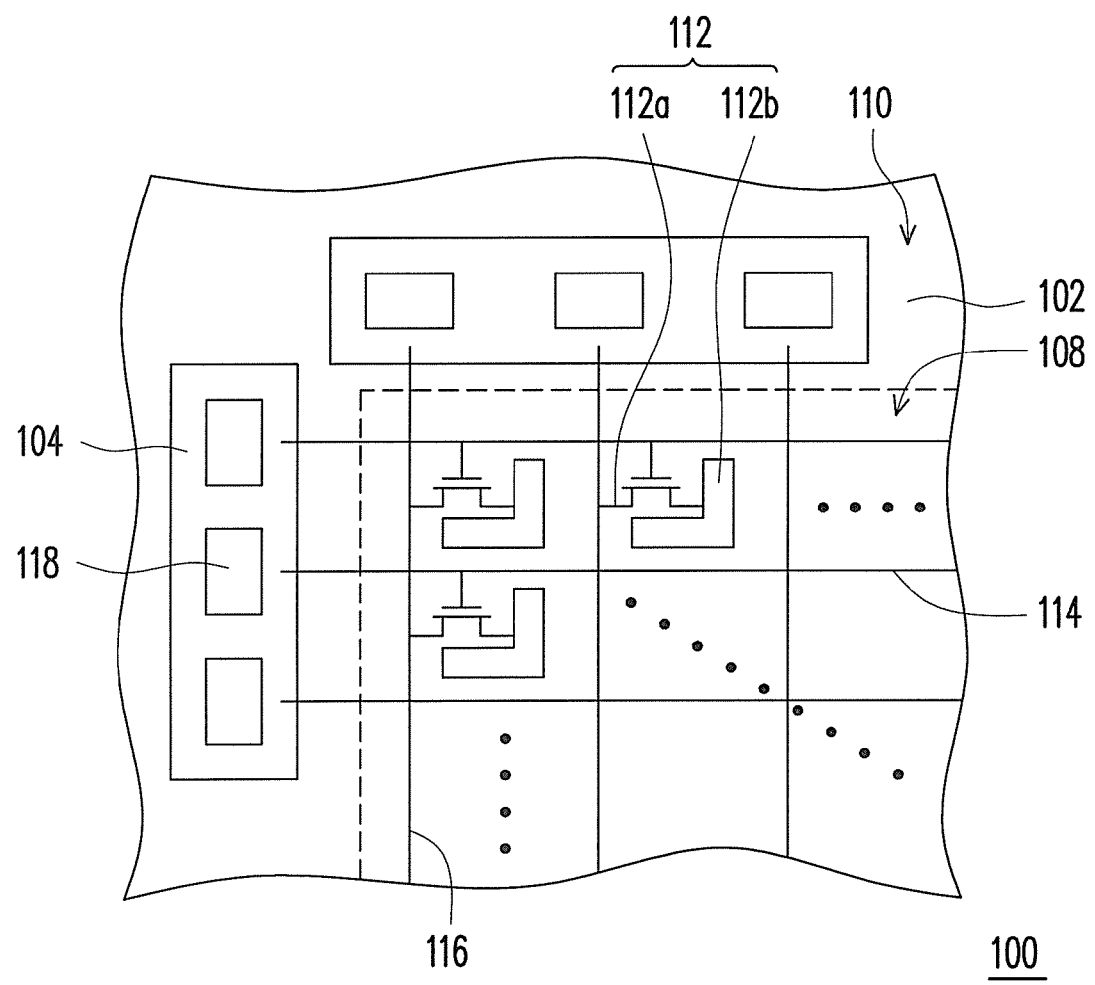
FIG. 1 is a schematic top view illustrating an active array substrate according to one embodiment of the present invention.

FIG. 1 illustrates a schematic top view of an active array substrate according to an embodiment of the present invention. Referring to FIG. 1, an active array substrate 100 of the present embodiment includes a substrate 102, a driving circuit 104, and an active array. The substrate 100 has an active region 108 and a peripheral circuit region 110. The material of the substrate 110 is glass, plastic, or other suitable materials, for example. The active array is disposed on the substrate 100, located within the active region 108, and electrically connected to the driving circuit 104. The active array includes a plurality of pixel structures 112, and a plurality of data lines 116 and a plurality of scan lines 114 which are electrically connected with the pixel structures 112. The material of the data lines 116 and the scan lines 114 is metal, for instance. Each pixel structure 112 is electrically connected to one data line 116 and one scan line 114 so as to perform the driving via the data line 116 and the scan line 114. Each pixel structure 112 mainly includes a thin film transistor (TFT) 112a and a pixel electrode 112b. The driving circuit 104 is disposed on the substrate 100 and located within the peripheral circuit region 110. The driving circuit 104 includes a plurality of bottom gate TFTs 118.

In accordance with different requirements in use, the bottom gate TFTs 118 can have different structures. In the following, various bottom gate TFTs are illustrated in detail.

Figure 2A:
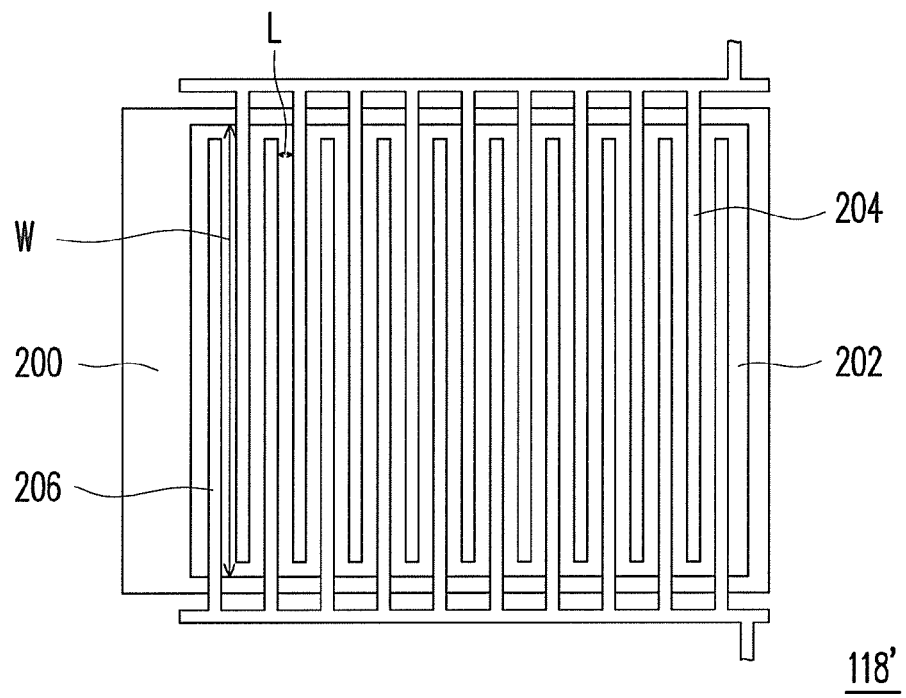
FIG. 2A is a schematic top view illustrating a bottom gate thin film transistor (TFT) according to one embodiment of the present invention.

FIG. 2A is a schematic top view illustrating a bottom gate TFT according to one embodiment of the present invention. Referring to FIG. 2A, a bottom gate TFT 118' includes a gate 200, a gate insulation layer (omitted to facilitate illustration), a semiconductor layer 202, a plurality of sources 204, and a plurality of drains 206. The material of the gate 200 is metal, for example, or materials with high thermal conductivity. Table 1(a) lists out the thermal conductivities of non-metallic materials and Table 1(b) lists out the thermal conductivities of metal materials. The materials disclosed in Table 1(b) can optionally be the materials of the gate 200.

TABLE 1(a)

| | Non-metallic material (W/mK) | | | |
| --- | --- | --- | --- | --- |
| | glass | amorphous | SiO$_2$ | SiN$_x$ |
| Thermal conductivity (W/mK) | 0.81 | 1.1 | 1.31 | 30 |

TABLE 1(b)

| | Metallic material | | | | | |
| --- | --- | --- | --- | --- | --- | --- |
| | Ti | Mo | Cr | Ni | Al | Cu |
| Thermal conductivity (W/mK) | 19 | 26 | 90 | 90 | 204 | 386 |

The gate 200 is a quadrilateral gate, for example. The gate insulation layer is disposed on the gate 200. The material of the gate insulation layer is silicon oxide (SiO$_2$), silicon nitride (SiN$_x$), or other suitable dielectric materials. The semiconductor layer 202 is disposed on the gate insulation layer and located above the gate 200 as a channel layer. Moreover, the material of the semiconductor layer 202 is amorphous, for instance. The semiconductor layer 202 is a quadrilateral semiconductor layer, for instance. An area ratio of the semiconductor layer 202 and the gate 200 is about 0.001 to 0.9. The sources 204 are electrically connected with each other and the drains 206 are electrically connected with each other. Moreover, the sources 204 and the drains 206 are separated. The material of the sources 204 and the drains 206 is metal, for instance. In addition, the extending directions of the sources 204 and the drains 206 are parallel to each other. The sources 204 and the drains 206 extend above the semiconductor layer 202 respectively from the two opposite sides of the gate 200. Furthermore, the sources 204 and the drains 206 are arranged alternately on the semiconductor layer 202 to increase the ratio of channel width W and length L of the bottom gate TFT 118 so as to raise the channel current.

Specifically, in the present embodiment, the gate 200 is a square gate, for example, and the semiconductor layer 202 is a square semiconductor layer, for example. Additionally, the method of increasing the area of the gate 200 is applied so that the area ratio of the semiconductor layer 202 and the gate 200 ranges from 0.001 to 0.9. The method of increasing the area of the gate 200, for instance, is to make the shortest distance between one side of the gate 200 and one side of the semiconductor layer 202 greater than 3 μm. When the channel current is raised to generate self-heating, since the material of the gate 200 is metal (which has high thermal conductivity)

and has a greater area relative to the semiconductor layer 202 (the area ratio between the semiconductor layer 202 and the gate 200 is about 0.001 to 0.9), the heat dissipation efficiency is therefore enhanced to conduct out the heat generated form self-heating, thereby enhancing the reliability of the devices.

Figure 2B:
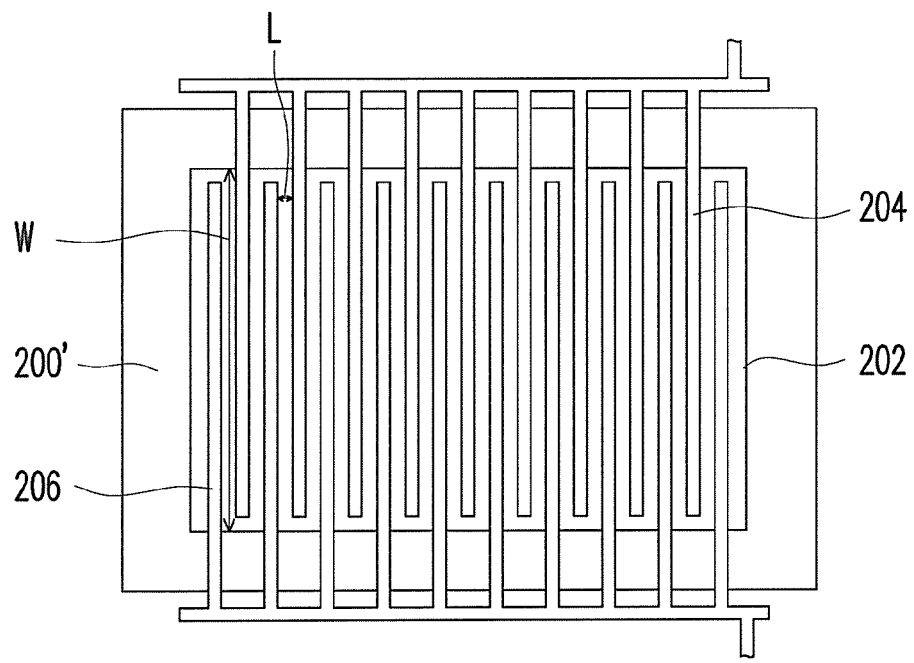
FIG. 2B is a schematic top view illustrating a bottom gate TFT according to another embodiment of the present invention.

It should be noted that in the present embodiment, the shortest distance between one side of the gate 200 and one side of the semiconductor layer 202 is greater than 3 μm, so that the area ratio of the semiconductor layer 202 and the gate 200 is about 0.001 to 0.9. In another embodiment, the shortest distances between the four sides of the gate and the four sides of the semiconductor layer are all greater than 3 μm (as illustrated in FIG. 2B), so as to increase the area of the gate (to reduce the area ratio between the semiconductor layer and the gate). In addition, in FIG. 2B, the shortest distances between every side of a gate 200' and every side of the semiconductor layer 202 can be the same or different. Obviously, in other embodiments, the shortest distances between the two sides of the gate and the two sides of the semiconductor layer are all greater than 3 μm, or the shortest distances between the three sides of the gate and the three sides of the semiconductor layer are all greater than 3 μm. Moreover, these shortest distances can be the same or different.

Figure 2C:
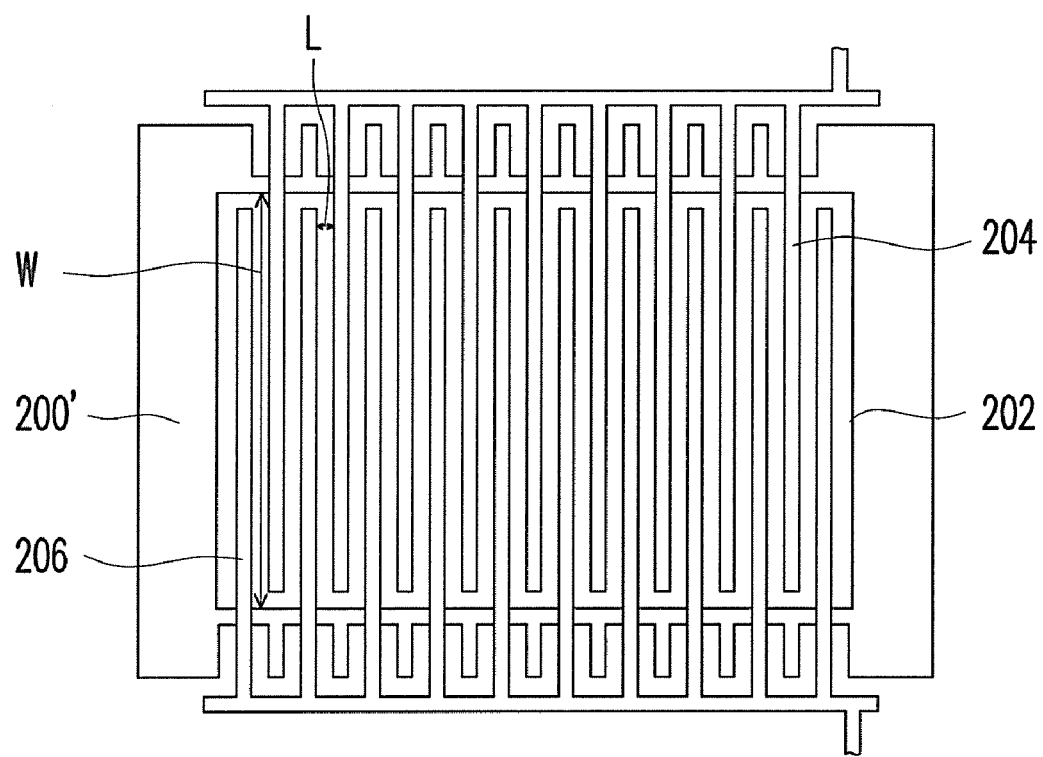
FIG. 2C is a schematic top view illustrating a bottom gate TFT according to another embodiment of the present invention.

Besides, in order to reduce the capacitive coupling generated between the gate 200' and the source 204 (or the drain 206), a portion of the gate 200' adjacent to the source 204 or the drain 206 is removed as illustrated in FIG. 2C.

Figure 3:
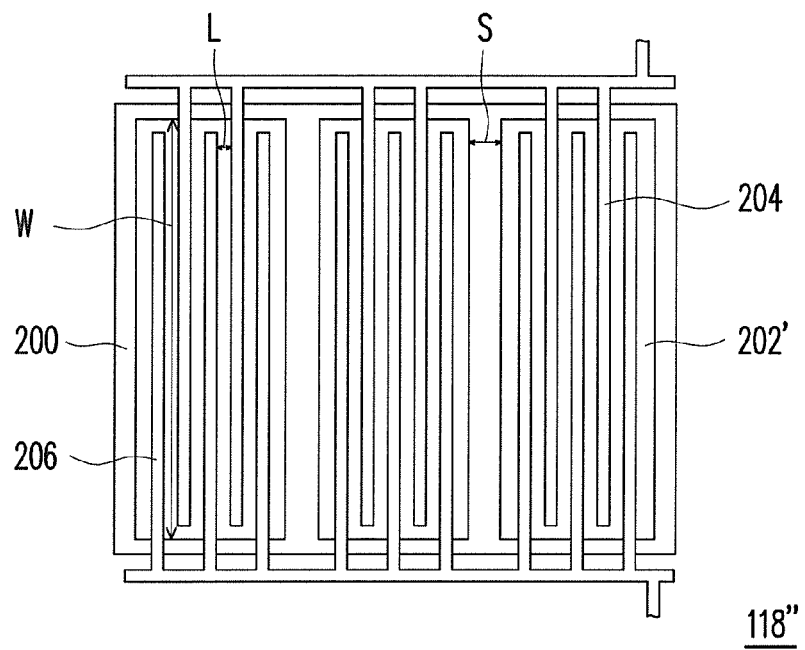
FIG. 3 is a schematic top view illustrating a bottom gate TFT according to another embodiment of the present invention.

FIG. 3 is a schematic top view illustrating a bottom gate TFT according to another embodiment of the present invention. Referring to FIG. 3, in order for the area ratio between a semiconductor layer 202' and the gate 200 to be about 0.001 to 0.9, the semiconductor layer 202' is a plurality of individual semiconductor patterns (not notated) in the bottom gate TFT 118". Furthermore, a distance S is maintained between any two adjacent semiconductor patterns. The distance S is about 3 μm to 100 μm, for instance. These distance S can be the same or different. In other words, in the present embodiment, the reliability of the devices is enhanced by decreasing the area of the semiconductor layer 202' to reduce self-heating.

Figure 7:
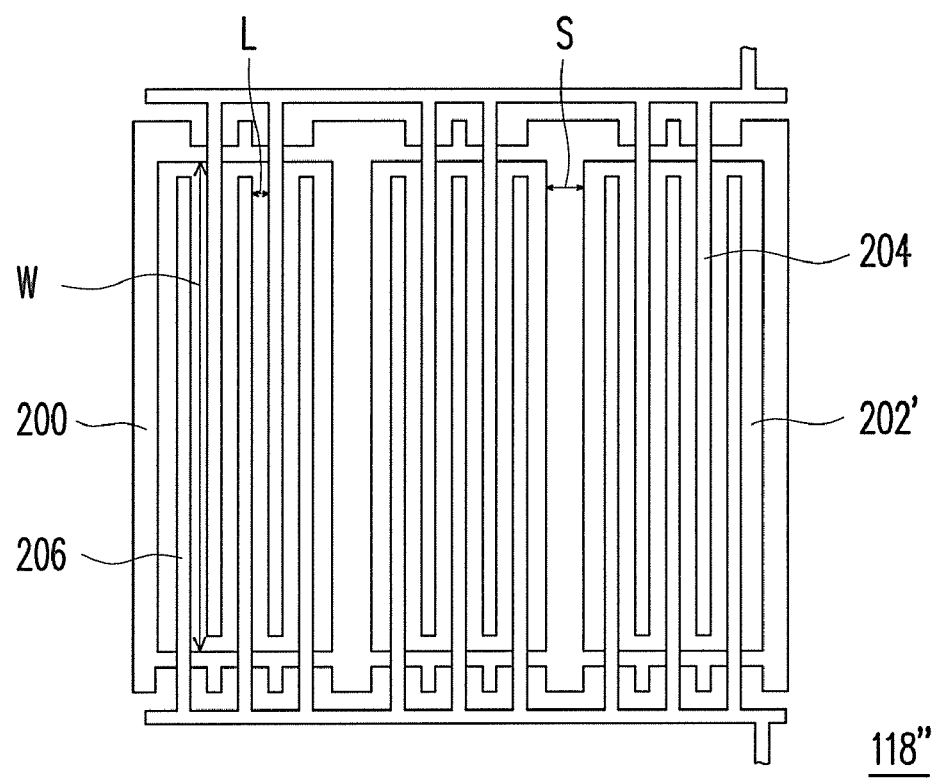
FIG. 7 is a schematic top view illustrating a bottom gate TFT according to another embodiment of the present invention.

Similarly, in order to reduce the capacitive coupling generated between the gate 200 and the source 204 (or the drain 206), a portion of the gate 200 adjacent to the source 204 or the drain 206 is removed as illustrated in FIG. 7.

It should be noted that when the semiconductor layer 202' is a plurality of individual semiconductor patterns, the method of increasing the gate area can also be adopted to further enhance the heat dissipation efficiency. In other embodiments, for example, the shortest distance(s) between one side (two sides, three sides, or four sides) of the gate 200 and one side (two sides, three sides, or four sides) of the semiconductor layer 202' is greater than 3 μm.

In the embodiments aforementioned, the gates are all square-shaped. In order to enhance the heat dissipation efficiency effectively, the gate and the semiconductor layer can also be rectangular-shaped.

Figure 4:
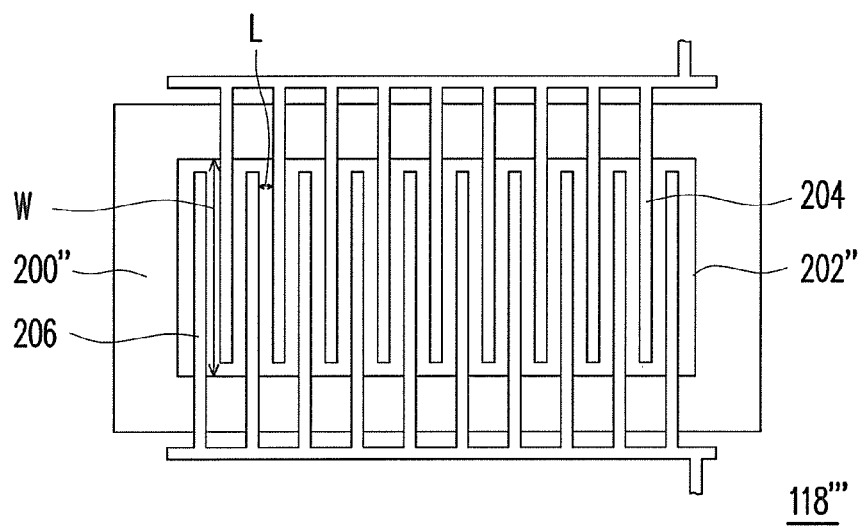
FIG. 4 is a schematic top view illustrating a bottom gate TFT according to another embodiment of the present invention.

FIG. 4 is a schematic top view illustrating a bottom gate TFT according to another embodiment of the present invention. Referring to FIG. 4, in the present embodiment, a gate 200" and a semiconductor layer 202" are both rectangular-shaped. The extending directions of the sources 204 and the drains 206 are parallel to the two short sides of the gate 200", for instance, and the sources 204 and the drains 206 respectively extend above the semiconductor layer 202" from the two long sides of the gate 200". Moreover, in FIG. 4, the relative positions of the remaining devices are similar to those of the devices in FIG. 2B. That is, the shortest distances between the four sides of the gate 200" and the four sides of the semiconductor layer 202" are all greater than 3 μm. Furthermore, these shortest distances can be the same or different.

Obviously, when both the gate 200" and the semiconductor layer 202" are rectangular-shaped, the shortest distance(s) between one side (two sides or three sides) of the gate 200" and one side (two sides or three sides) of the semiconductor layer 202" is greater than 3 μm; or the semiconductor 202" is a plurality of individual semiconductor patterns, and a distance is maintained among any two adjacent semiconductor patterns; or the shortest distance between one side (two sides or three sides) of the gate 200" and one side (two sides or three sides) of the semiconductor layer 202" are all greater than 3 μm, and the semiconductor layer 202" is the individual semiconductor patterns and a distance is maintained between any two adjacent semiconductor patterns.

In the following, the effects achieved in the present invention are illustrated with FIG. 5 and FIG. 6.

Figure 5:
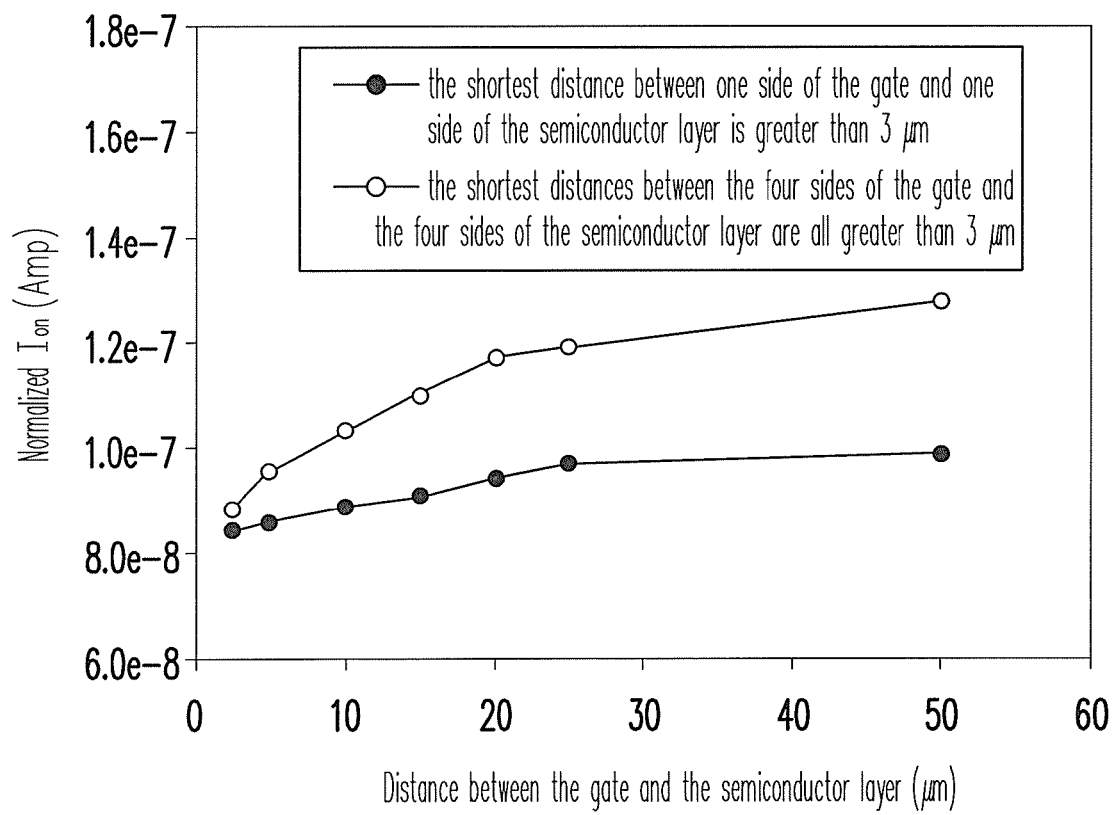
FIG. 5 is a diagram illustrating the relationship of the distance between the gate and the semiconductor layer and the normalized channel current.

FIG. 5 is a diagram illustrating the relationship of the distance between the gate and the semiconductor layer and the normalized channel current. As illustrated in FIG. 5, as the distance between the gate and the semiconductor layer increases, compared to the situation where the shortest distance between one side of the gate and one side of the semiconductor layer is greater than 3 μm (black dots), when the shortest distances between the four sides of the gate and the four sides of the semiconductor layer are all greater than 3 μm (white dots), the normalized channel current of the white dots are higher than that of the black dots. That is, TFT having the structure according to the white dot has less degradation than the black dot.

Figure 6:
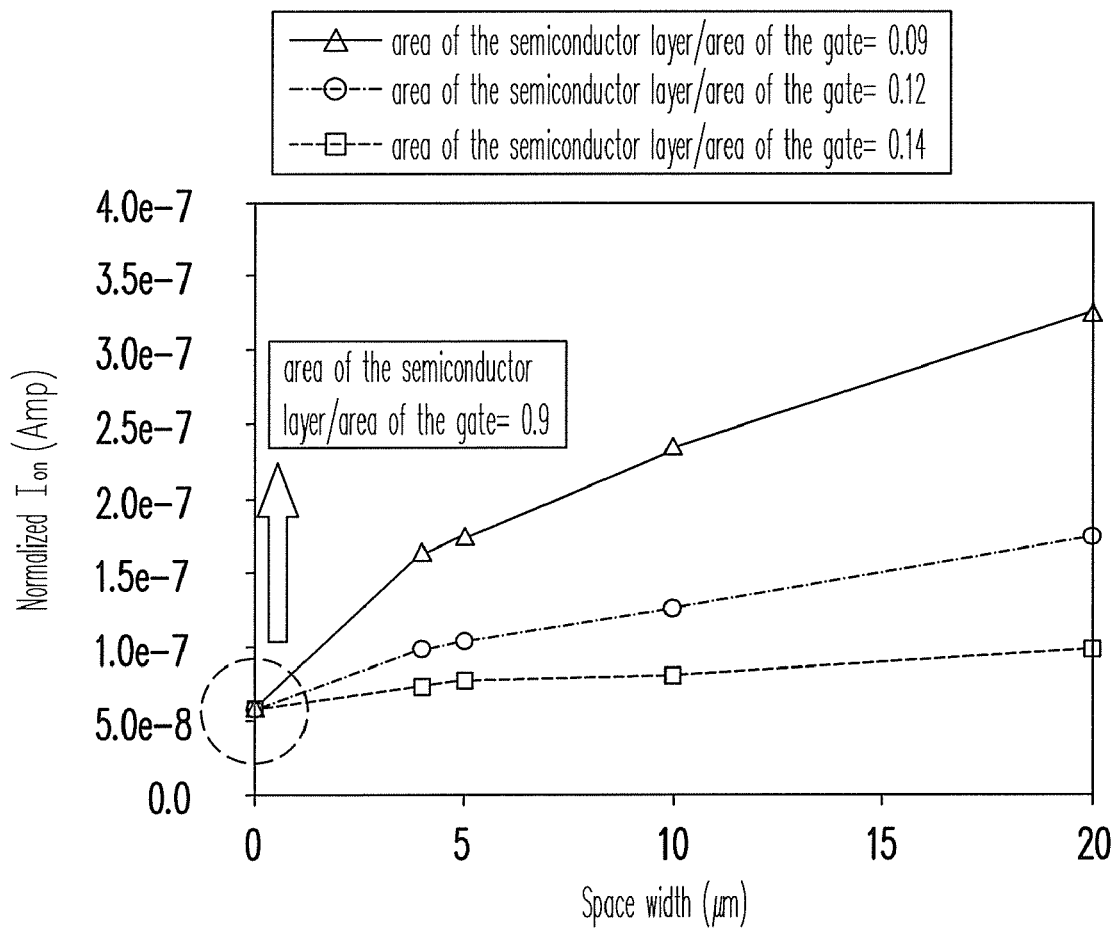
FIG. 6 is a diagram illustrating the relationship between the space among the semiconductor patterns and the normalized channel current.

FIG. 6 is a diagram illustrating the relationship between the space width among the semiconductor patterns and the normalized channel current. As illustrated in FIG. 6, when the area of the semiconductor layer is decreased or when the space between the semiconductor patterns is increased, the normalized channel current then is increased. In FIG. 6, triangle dots, circle dots and square dots indicate the ratio of area of the semiconductor layer and area of the gate being 0.09, 0.12, and 0.14, respectively; dotted-line circle indicates the ratio of area of the semiconductor layer and area of the gate is 0.9. That is, the TFT having the structure according to the triangle dot has less degradation.

In summary, in the present invention, by increasing the area of the gate, reducing the area of the semiconductor layer, or altering the shapes of the semiconductor layer and the gate, the area ratio of the semiconductor layer and the gate is ranged from 0.001 to 0.9. As a result, when the channel current is increased to generate self-heating, the heat dissipation efficiency is enhanced effectively so as to avoid the self-heating which reduces the reliability of the devices.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:
1. A bottom gate thin film transistor, comprising:
a gate;
a gate insulation layer disposed on the gate;
a semiconductor layer disposed on the gate insulation layer and located above the gate, wherein an area ratio of the semiconductor layer and the gate is about 0.001 to 0.09;
a plurality of sources; and a plurality of drains, wherein the sources are electrically connected with each other while the drains are electrically connected with each other.

2. The bottom gate thin film transistor as claimed in claim 1, wherein the gate is a quadrilateral gate and the semiconductor layer is a quadrilateral semiconductor layer.

3. The bottom gate thin film transistor as claimed in claim 2, wherein the quadrilateral gate is a square gate and the semiconductor layer is a square semiconductor layer.

4. The bottom gate thin film transistor as claimed in claim 2, wherein the quadrilateral gate is a rectangular gate and the semiconductor layer is a rectangular semiconductor layer.

5. The bottom gate thin film transistor as claimed in claim 4, wherein extending directions of the sources and the drains are parallel to two short sides of the quadrilateral gate, and the sources and the drains extend above the semiconductor layer from two long sides of the quadrilateral gate respectively.

6. The bottom gate thin film transistor as claimed in claim 5, wherein the sources and the drains are arranged alternately on the semiconductor layer.

7. The bottom gate thin film transistor as claimed in claim 2, wherein the extending directions of the sources and the drains are parallel to each other and the sources and the drains extend above the semiconductor layer respectively from two opposite sides of the quadrilateral gate.

8. The bottom gate thin film transistor as claimed in claim 7, wherein the sources and the drains are arranged alternately on the semiconductor layer.

9. The bottom gate thin film transistor as claimed in claim 1, wherein a shortest distance between at least one side of the quadrilateral gate and one side of the quadrilateral semiconductor layer is greater than 3 micrometer ($\mu$m).

10. The bottom gate thin film transistor as claimed in claim 1, wherein the semiconductor layer comprises an amorphous layer.

11. The bottom gate thin film transistor as claimed in claim 1, wherein the semiconductor layer comprises a plurality of individual semiconductor patterns and a space is maintained between any two adjacent semiconductor patterns.

12. The bottom gate thin film transistor as claimed in claim 11, wherein the space is about 3 $\mu$m to 100 $\mu$m.

13. The bottom gate thin film transistor as claimed in claim 11, wherein the gate is a quadrilateral gate and the semiconductor layer is a quadrilateral semiconductor layer.

14. The bottom gate thin film transistor as claimed in claim 13, wherein a shortest distance between at least one side of the quadrilateral gate and one side of the quadrilateral semiconductor layer is greater than 3 $\mu$m.

15. An active array substrate, comprising:
a substrate comprising an active region and a peripheral circuit region;
a driving circuit disposed on the substrate and located within the peripheral circuit region, wherein the driving circuit comprises a plurality of bottom gate thin film transistors as claimed in claims 1; and
an active array disposed on the substrate, located within the active region and electrically connected to the driving circuit.

* * * * *